United States Patent
Guo et al.

(10) Patent No.: US 8,527,232 B2
(45) Date of Patent: Sep. 3, 2013

(54) DIAGNOSTIC TEST PATTERN GENERATION FOR SMALL DELAY DEFECT

(75) Inventors: Ruifeng Guo, Portland, OR (US); Wu-Tung Cheng, Lake Oswego, OR (US); Takeo Kobayashi, Beaverton, OR (US); Kun-Han Tsai, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 422 days.

(21) Appl. No.: 12/768,592

(22) Filed: Apr. 27, 2010

(65) Prior Publication Data
US 2010/0274518 A1 Oct. 28, 2010

Related U.S. Application Data

(60) Provisional application No. 61/172,881, filed on Apr. 27, 2009.

(51) Int. Cl.
*G01R 31/00* (2006.01)

(52) U.S. Cl.
USPC ............ 702/120; 702/117; 702/118; 702/123

(58) Field of Classification Search
USPC .................. 702/117, 118, 120, 123; 714/37, 714/25, 724, 738; 716/100
See application file for complete search history.

(56) References Cited

U.S. PATENT DOCUMENTS

| | | | |
|---|---|---|---|
| 6,367,029 B1 * | 4/2002 | Mayhead et al. | 714/2 |
| 7,039,845 B2 * | 5/2006 | Rearick et al. | 714/738 |
| 7,278,122 B2 * | 10/2007 | Willis | 716/104 |
| 2009/0235134 A1 * | 9/2009 | Guo et al. | 714/726 |

OTHER PUBLICATIONS

Y.Sato, et al., "Invisible Delay Quality—SDQM Model Lights Up What Could Not Be Seen", ITC, 2005, pp. 47.1-47.9.
X. Lin, et al., "Timing-Aware ATPG for High Quality At-speed Testing of Small Delay Defects", ATS, 2006, pp. 139-146.
S. Kajihara, et al. "A Framework of High-Quality Transition Fault ATPG for Scan Circuits", Proc. ITC, 2006, Paper 2.1.
T. Aikyo, et al., "Timing-Aware Diagnosis for Small Delay Defects", ISDFT, 2007, pp. 223-231.
Y.-C. Hsu, S. K. Gupta, "A New Path-Oriented Effect-Cause Methodology to Diagnose Delay Failures," ITC, 1998, pp. 758-767.
A. Krstic, L.-C Wang, K.-T, Cheng, J.-J. Liou, T.M. Mak, "Enhancing Diagnosis Resolution for Delay Defects Based Upon Statistical Timing and Statistical Fault Models," DAC, 2003, pp. 668-673.
W.-T. Cheng, et al., "Enhancing Transition Fault Model for Delay Defect Diagnosis", ATS, 2008, pp. 179-184.
Y.-Y. Chen and J.-J. Liou, "Diagnosis Framework for Locating Failed Segments of Path Delay Faults", IEEE Trans. on VLSI, vol. 16, No. 6, 2008, pp. 755-765.

(Continued)

*Primary Examiner* — Elias Desta

(57) ABSTRACT

Methods of diagnostic test pattern generation for small delay defects are based on identification and activation of long paths passing through diagnosis suspects. The long paths are determined according to some criteria such as path delay values calculated with SDF (Standard Delay Format) timing information and the number of logic gates on a path. In some embodiments of the invention, the long paths are the longest paths passing through a diagnosis suspect and reaching a corresponding failing observation point selected from the failure log, and N longest paths are identified for each of such pairs.

12 Claims, 6 Drawing Sheets

(56) References Cited

OTHER PUBLICATIONS

P. Camurati, et al., "A Diagnostic Test Pattern Generation Algorithm", Proc. ITC, 1990, pp. 52-58.

T. Bartenstein, "Fault Distinguishing Pattern Generation", in Proc. ITC, 2000, pp. 820-828.

N. Bhatti, R. D. Blanton, Diagnostic Test Generation for Arbitrary Faults, Proc. ITC, 2006, paper 19.2.

Z. Wang, et al., Multiple Fault Diagnosis using N-detection Tests, Proc. ICCD 2003, pp. 198-201.

K. Gearhardt, et al., "Improving Fault Isolation using Iterative Diagnosis", ISTFA, 2008, Paper 13.2.

J. Ghosh-Dastidar, et al, "Adaptive Techniques for Improving Delay Fault Diagnosis", VTS, 1999, pp. 168-172.

V. Mehta, et al. "Delay Fault Diagnosis for Non-Robust Test", Proc. ISQED, 2006.

\* cited by examiner

DIAGNOSTIC TEST PATTERN GENERATION FOR SMALL DELAY DEFECT

RELATED APPLICATIONS

This application claims priority to U.S. Provisional Patent Application No. 61/172,881, entitled "Diagnostic Test Generation For Small Delay Defect," filed on Apr. 27, 2009, and naming Ruifeng Guo et al. as inventors, which application is incorporated entirely herein by reference.

FIELD OF THE INVENTION

The present invention is directed to generating test patterns for fault diagnosis of integrated circuits. Various aspects of the invention may be particularly useful for improving the diagnosis resolution for small delay defect.

BACKGROUND OF THE INVENTION

Experimental data going back two decades have shown the distribution of delay-related failures is skewed toward small delays. That is, the majority of devices that fail due to delay defects fail because of "small delay defects." Small delay defects contribute to delays shorter than the clock cycles associated with the design and process technology node. As design sizes and performance continue to increase, more and more designs will be susceptible to small delay defects. Detecting and isolating small delay defects, therefore, have attracted considerable effort in the VLSI (very-large-scale integration) test community.

Two main fault models have been developed for timing related defects. The transition delay fault model is commonly used by ATPG (automatic test pattern generation) tools to target timing related defects, whereby the conditions for detection are that a transition has occurred on the node, and the logic effect of that transition has been propagated to and captured by a scan cell. Detection of a transition fault is generally independent of which path is used to sensitize and propagate the fault because it assumes that a delay defect causes a delay longer than one clock cycle. Many ATPG tools, optimized to minimize run time and pattern counts, tend to generate tests using shorter paths rather than longer ones. Consequently, some small delay defects may not be detected when the paths activated are too short for any delay effects to be observed at a scan cell.

The path delay fault model is also used for at-speed scan testing. This model tests the cumulative effect of all delays along a specific path. Unfortunately, the number of paths as a function of circuit size can grow exponentially, and it is therefore only practical to target a limited number of critical paths with this fault model. Because the tested paths are usually a very small fraction of the paths in the design that can be targeted, only those small delay defects along the tested paths may be detected.

Even after small delay defects are detected, isolating and identifying these defects remain challenging. Small delay defects usually cause much fewer failures on a tester since not all paths can lead to failures at scan cells as explained above. As such, each failure captured may be associated with a large number of defect suspects, leading to low diagnosis resolutions. While timing information from a logical or physical design may be used to improve diagnosis resolutions, the timing information is often insufficient as many small delay defects are caused by manufacturing process variations.

FIG. 1 illustrates some of the diagnosis challenges. It can be assumed that a small delay defect 110 at the output of gate m in the circuit causes a failure that can only be propagated along the longest path 120 and exhibits the fault effect at observation point a 130. It also can be assumed that only one test pattern activates this longest path during the production test and causes a single failure at observation point a 130. Since there is only a single failing bit, the diagnosis report usually contains multiple suspects (the gates' inputs and outputs that might cause the failure at point a 130). In this example, the input and output of all the gates in the figure {f, g, h, i, j, k, m} may be reported as diagnosis suspects. On the other hand, if the defect at the output of gate m is of normal and large size, many paths passing through m may lead to multiple failing bits and thus the list of diagnosis suspects should be considerably shorter. Thus, it is more difficult to pinpoint and locate small delay defects. Note that failing bits, failing scan cells and failing observation points are used herein interchangeably.

In general, there are two approaches to diagnosis. The first is to develop an algorithm for a particular fault model, such as transition delay and path delay fault models. These algorithms may target single- or multiple-fault locations. For example, fault simulation based on SLAT (single location at a time) has been developed for multiple defects. The second approach to diagnosis is to create a fault dictionary upfront. This fault dictionary stores signatures of all potential faults in a circuit. When a chip fails on a tester, the failure on the tester is compared to the fault signature entries stored in the fault dictionary, and the fault signature that best matches the tester failure will be treated as the best defect suspect. While both approaches work well, the diagnosis resolution sometimes is limited by production test patterns or the number of failures collected on a tester. In order to achieve higher diagnosis resolution before the more expensive physical fault isolation process, diagnostic test pattern generation (DTPG) techniques is usually used. DTPG techniques can be used with either of the two diagnosis approaches described above.

A number of DTPG methods have been developed. In T. Bartenstein, "Fault Distinguishing Pattern Generation", Proc. ITC, 2000, pp. 820-828, which is incorporated herein by reference, each pattern in a diagnostic test pattern set is used to distinguish a pair of suspect defects. In another words, for each pair of suspects (e.g. m and j in FIG. 1), the diagnostic test generation usually tries to activate and propagate one suspect without activating or propagating the other one. In Z. Wang, et al., "Multiple Fault Diagnosis using N-detection Tests", Proc. ICCD, 2003, pp. 198-201, which is incorporated herein by reference, each suspect is detected by n different test patterns. The n different test patterns are test patterns that can activate and propagate the faulty effect of the suspect along different paths. Neither method, however, is designed to target small delay defects. Accordingly, some small delay defects may be missed when none of the long paths required for detecting these small delay defects are activated by the test pattern set generated. Several other methods apply timing information to guide diagnostic test pattern generation. As already mentioned, the timing information and static timing analysis might be insufficient for diagnosing small delay defects due to timing model inaccuracy and manufacturing process variations.

BRIEF SUMMARY OF THE INVENTION

Aspects of the invention relate to methods of diagnostic test pattern generation for small delay defects. With various implementations of the invention, a plurality of long paths that pass through a diagnosis suspect are identified based on one or more criteria, and then test patterns that activate the plurality of long paths are generated. Path delay values calculated with SDF (Standard Delay Format) timing information may be used as a criterion for identifying long paths. Another criterion is the number of logic gates on a path. Diagnosis suspects can be obtained by performing diagnosis on a failure log. In some embodiments of the invention, the long paths are the longest paths passing through a diagnosis suspect and reaching one of the failing observation points associated with the diagnosis suspect.

DETAILED DESCRIPTION OF THE INVENTION

Various aspects of the present invention relate to DTPG techniques for small delay defects. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or a networked computer.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate" and "determine" to describe the disclosed methods. Such terms are high-level abstractions of the actual operations that are performed. The actual operations that correspond to these terms will vary depending on the particular implementation and are readily discernible by one of ordinary skill in the art.

Operating Environment

Figure 1:
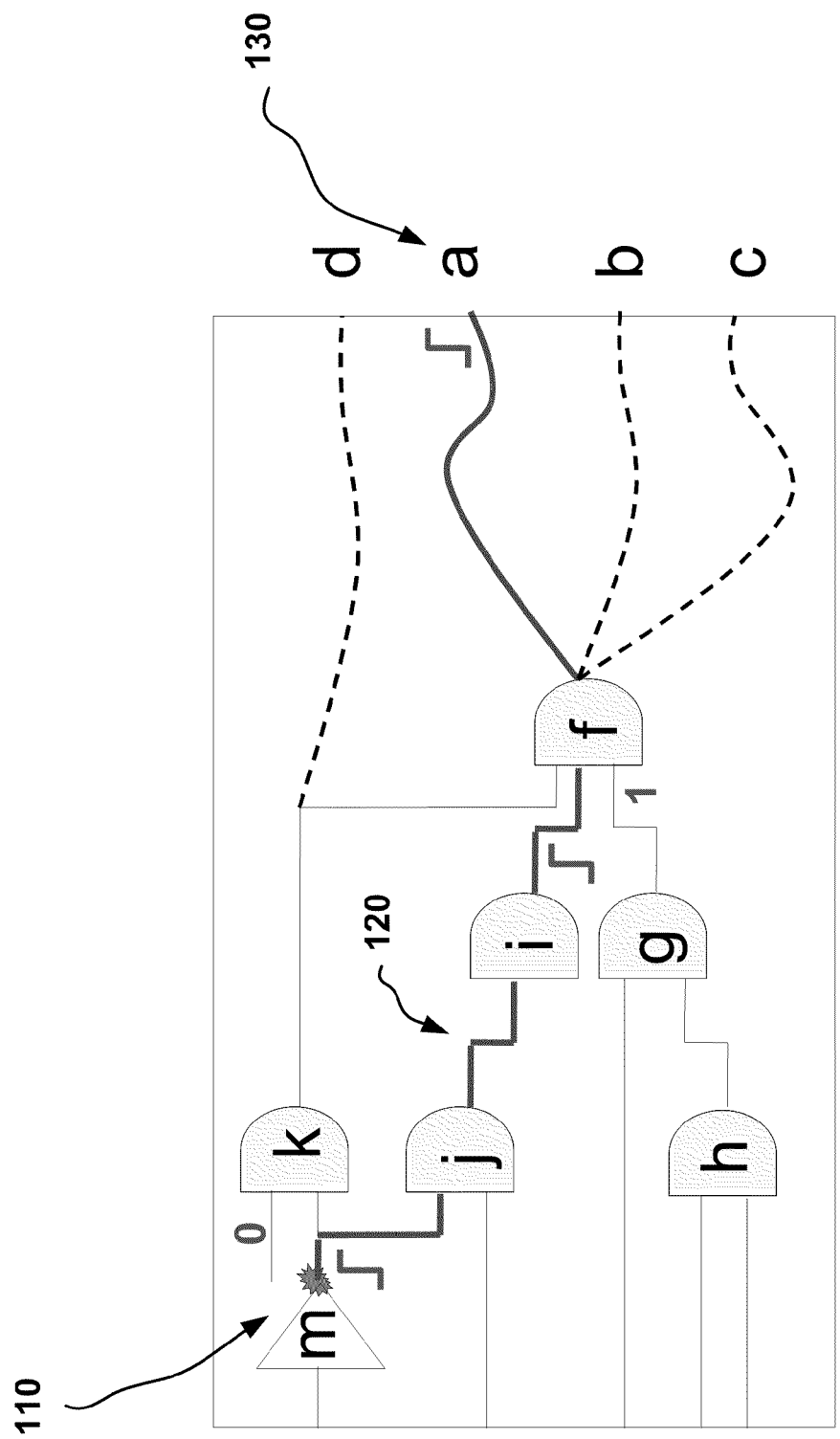
FIG. 1 illustrates a simple circuit to show some of the challenges for diagnosing small delay defects.
Figure 2:
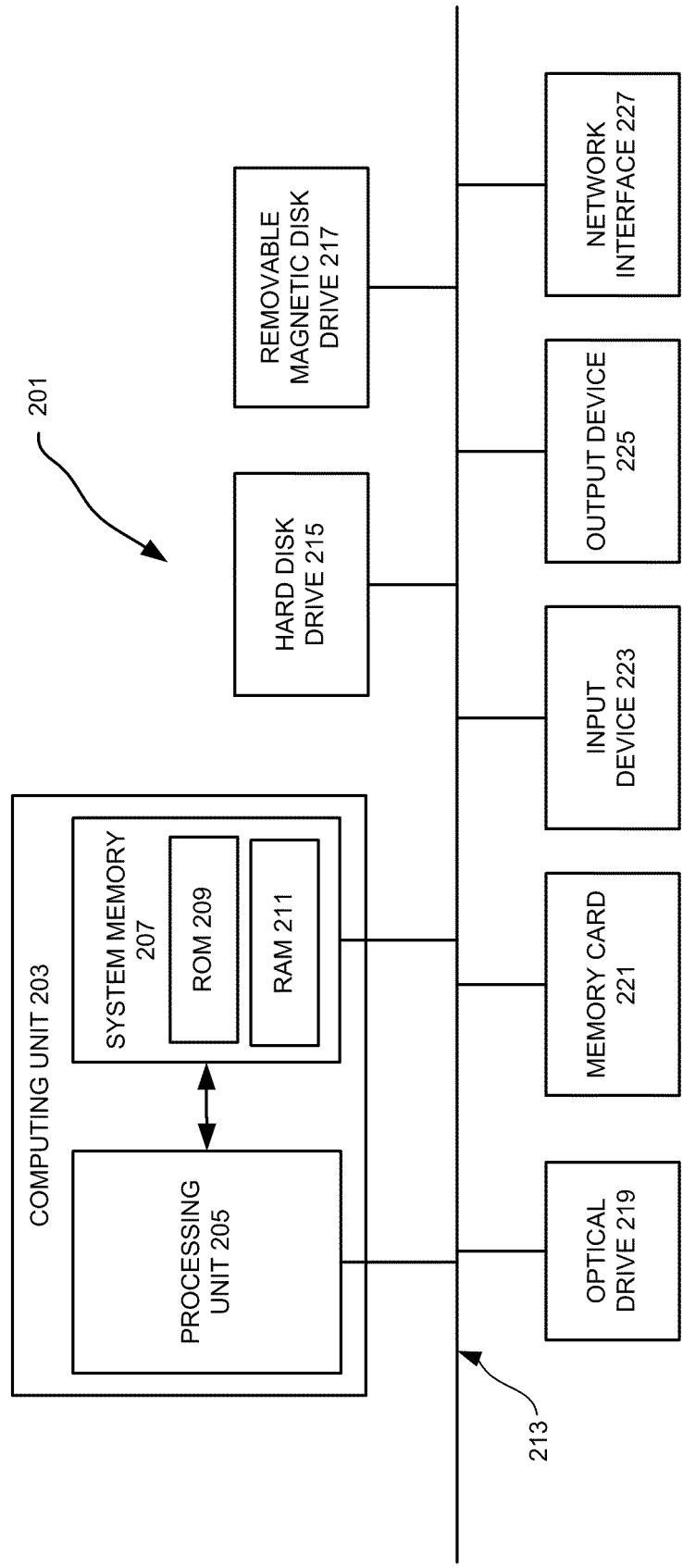
FIG. 2 illustrates a programmable computer system with which various embodiments of the invention may be employed.

Various examples of the invention may be implemented through the execution of software instructions by a computing device, such as a programmable computer. Accordingly, FIG. 2 shows an illustrative example of a computing device 201. As seen in this figure, the computing device 201 includes a computing unit 203 with a processing unit 205 and a system memory 207. The processing unit 205 may be any type of programmable electronic device for executing software instructions, but will conventionally be a microprocessor. The system memory 207 may include both a read-only memory (ROM) 209 and a random access memory (RAM) 211. As will be appreciated by those of ordinary skill in the art, both the read-only memory (ROM) 209 and the random access memory (RAM) 211 may store software instructions for execution by the processing unit 205.

The processing unit 205 and the system memory 207 are connected, either directly or indirectly, through a bus 213 or alternate communication structure, to one or more peripheral devices. For example, the processing unit 205 or the system memory 207 may be directly or indirectly connected to one or more additional memory storage devices, such as a "hard" magnetic disk drive 215, a removable magnetic disk drive 217, an optical disk drive 219, or a flash memory card 221. The processing unit 205 and the system memory 207 also may be directly or indirectly connected to one or more input devices 223 and one or more output devices 225. The input devices 223 may include, for example, a keyboard, a pointing device (such as a mouse, touchpad, stylus, trackball, or joystick), a scanner, a camera, and a microphone. The output devices 225 may include, for example, a monitor display, a printer and speakers. With various examples of the computer 201, one or more of the peripheral devices 215-225 may be internally housed with the computing unit 203. Alternately, one or more of the peripheral devices 215-225 may be external to the housing for the computing unit 203 and connected to the bus 213 through, for example, a Universal Serial Bus (USB) connection.

With some implementations, the computing unit 203 may be directly or indirectly connected to one or more network interfaces 227 for communicating with other devices making up a network. The network interface 227 translates data and control signals from the computing unit 203 into network messages according to one or more communication protocols, such as the transmission control protocol (TCP) and the Internet protocol (IP). Also, the interface 227 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 201 is illustrated as an example only, and it not intended to be limiting. Various embodiments of the invention may be implemented using one or more computing devices that include the components of the computer 201 illustrated in FIG. 2, which include only a subset of the components illustrated in FIG. 2, or which include an alternate combination of components, including components that are not shown in FIG. 2. For example, various embodiments of the invention may be implemented using a multi-processor computer, a plurality of single and/or multiprocessor computers arranged into a network, or some combination of both.

Diagnostic Test Pattern Generation

Figure 3:
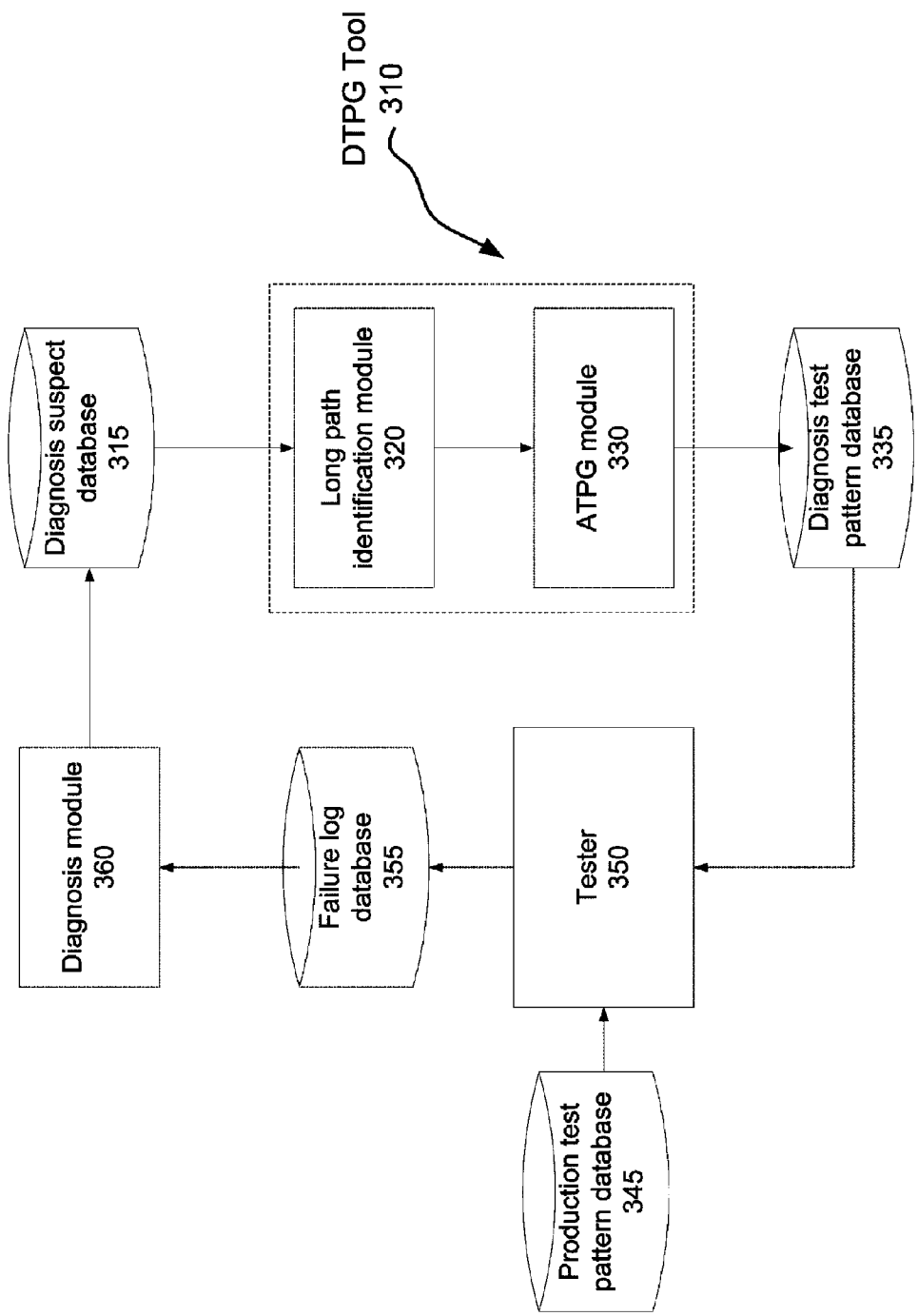
FIG. 3 illustrates a DTPG (diagnostic test pattern generation) tool that may be implemented according to various embodiments of the invention.

FIG. 3 illustrates an example of a DTPG tool 310 that may be implemented according to various embodiments of the invention. As seen in the figure, The DTPG tool 310 includes a long path identification module 320 and an ATPG module 330. As also shown in this figure, various implementations of the DTPG tool 310 may cooperate with (or incorporate, in whole or part) a diagnosis module 360, a tester 350 and four databases (a diagnosis suspect database 315, a diagnosis test pattern database 335, a production test pattern database 345 and a failure log database 355).

The tester 350 is configured to test integrated circuits using test patterns. Production test patterns are supplied to the tester 350 from the production test pattern database 345. After the circuit is tested, a failure log is generated and stored in the failure log database 355. The failure log includes failing observation points (failing bits). The diagnosis module 360 conducts a diagnosis of the failure log to generate diagnosis suspects, which are stored in the diagnosis suspect database 315. Based on the diagnosis suspects, the DTPG tool 310 generates a test pattern set for isolating and locating defects, especially small delay defects. The detailed process regarding how the DTPG tool 310 works will be discussed below.

As previously noted, various embodiments of the invention may be embodied by a computing system, such as the computing system illustrated in FIG. 2. Accordingly, one or more components of each of the diagnosis module 360, the long path identification module 320 and the ATPG module 330 may be implemented using one or more processors in a computing system. It should be appreciated that, while the diagnosis module 360, the long path identification module 320 and the ATPG module 330 are shown as separate units in FIG. 2, a single computer (or a single process in a computing system) may be used to implement two or more of these modules at different times. Also, various examples of the invention may be embodied by software-executable instructions, stored on a computer-readable medium, for instructing a computing system to implement one or more components of each of the diagnosis module 360, the long path identification module 320 and the ATPG module 330. Further, while the diagnosis suspect database 315, the diagnosis test pattern database 335, the production test pattern database 345 and the failure log database are shown as separate units in FIG. 2, a single computer accessible medium may be used to implement two or more of these databases at different times.

Various methods of DTPG for small delay defects according to embodiments of the invention will now be discussed with respect to the flowchart illustrated in FIG. 4. While the operations illustrated in FIG. 4 will be described with reference to the DTPG tool shown in FIG. 3, it should be appreciated that the operations illustrated in FIG. 4 may be employed by other implementations of a DTPG tool according to various embodiments of the invention. Likewise, it should be appreciated that the DTPG tool shown in FIG. 3 may be used to perform methods according to various embodiments of the invention different from those encompassed by the flowchart of FIG. 4.

Figure 4:
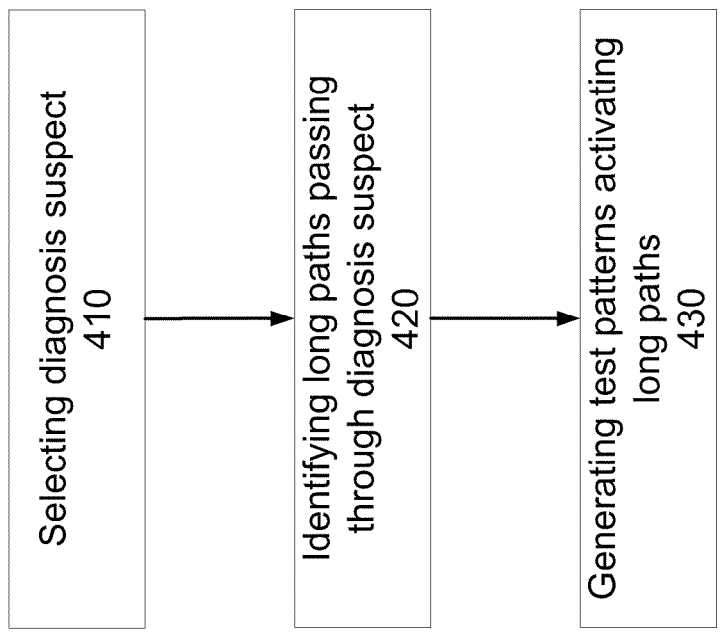
FIG. 4 shows a flowchart for a DTPG method according to various embodiments of the invention.

Also, it should be appreciated that various embodiments of the invention may be implemented by a system comprising one or more processors programmed to perform the operations described in FIG. 4. Still further, various embodiments of the invention may be implemented by processor-executable instructions, stored in a processor-readable medium, for causing one or more processors to perform the operations described in FIG. 4.

The flow illustrated in FIG. 4 starts with operation 410, selecting a diagnosis suspect. A diagnosis suspect is a suspect for causing one or more observation points (scan cells) to exhibit faulty effects, i.e. showing values different from expected values. There are a number of approaches to determine a diagnosis suspect. For example, the diagnosis module 360 analyzes a failure log generated by the tester 350 to identify diagnosis suspects for a failing observation point listed in the failure log. The diagnosis module 360 may use any conventional scan test diagnosis tool such as the scan test diagnosis tool provided in the Tessent™ Diagnosis family of test tools available from Mentor Graphics Corporation of Wilsonville, Oreg. After diagnosis suspects are determined, in operation 410, a diagnosis suspect is selected for the next operation.

Figure 5:
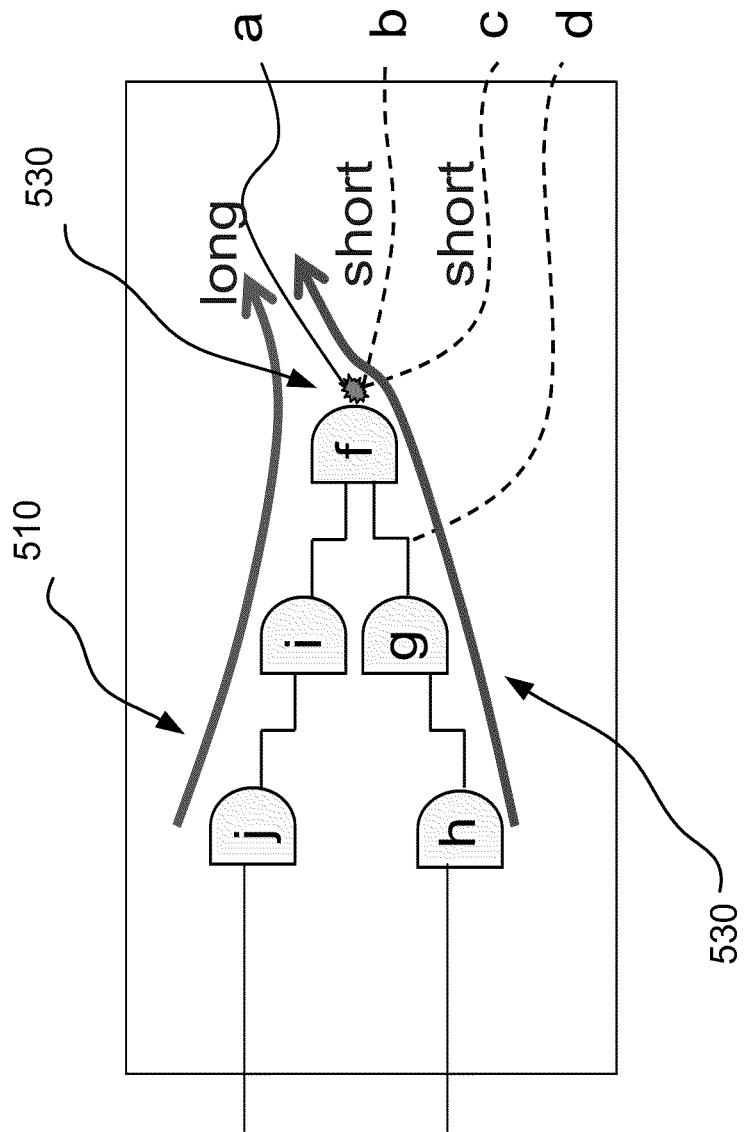
FIG. 5 illustrates a simple circuit to show some aspects for DTPG methods according to various embodiments of the invention.

In operation 420, the long path identification module 320 identifies, according to some criteria, long paths passing through the selected diagnosis suspect. Different criteria can be used to determine the long paths. For example, timing information can be used when the standard delay format (SDF) file is available. The number of logic gates on the path can also be used for the selection. The number of long paths may be a predetermined number N (e.g. N=100). Two factors, among others, can be used to determine N: running time of the method and pattern counts. In some embodiments of the invention, the long paths are the longest paths. Identifying N longest paths helps to increase the chance that a small delay defect not only can be detected but also may be located, as illustrated in FIG. 5. FIG. 5 shows two paths (510 and 520) that can be used to detect a small delay defect 530. A production test pattern set stored in database 345 may only activate (sensitize) the path 510 from gate j to observation point a, and miss another long path 520 from gate h to observation point a. By comparison, operation 420 can identify both long paths. Here, activating/sensitizing a path means that a defect on the path can be excited and the faulty effect can be observed at the observation point of the path.

According to various embodiments of the invention, operation 420 may limit paths being considered to those not only passing through the selected diagnosis suspect, but also reaching one of the failing observation points associated with the selected diagnosis suspect and listed in the failure log. While this may increase efficiency and limit pattern counts, it should be appreciated by those of ordinary skill in the art that this is not the only way implementing operation 420. Operations 410 and 420 may be repeated until N long paths have been identified for each pair of diagnosis suspect and failing observation point.

Figure 6:
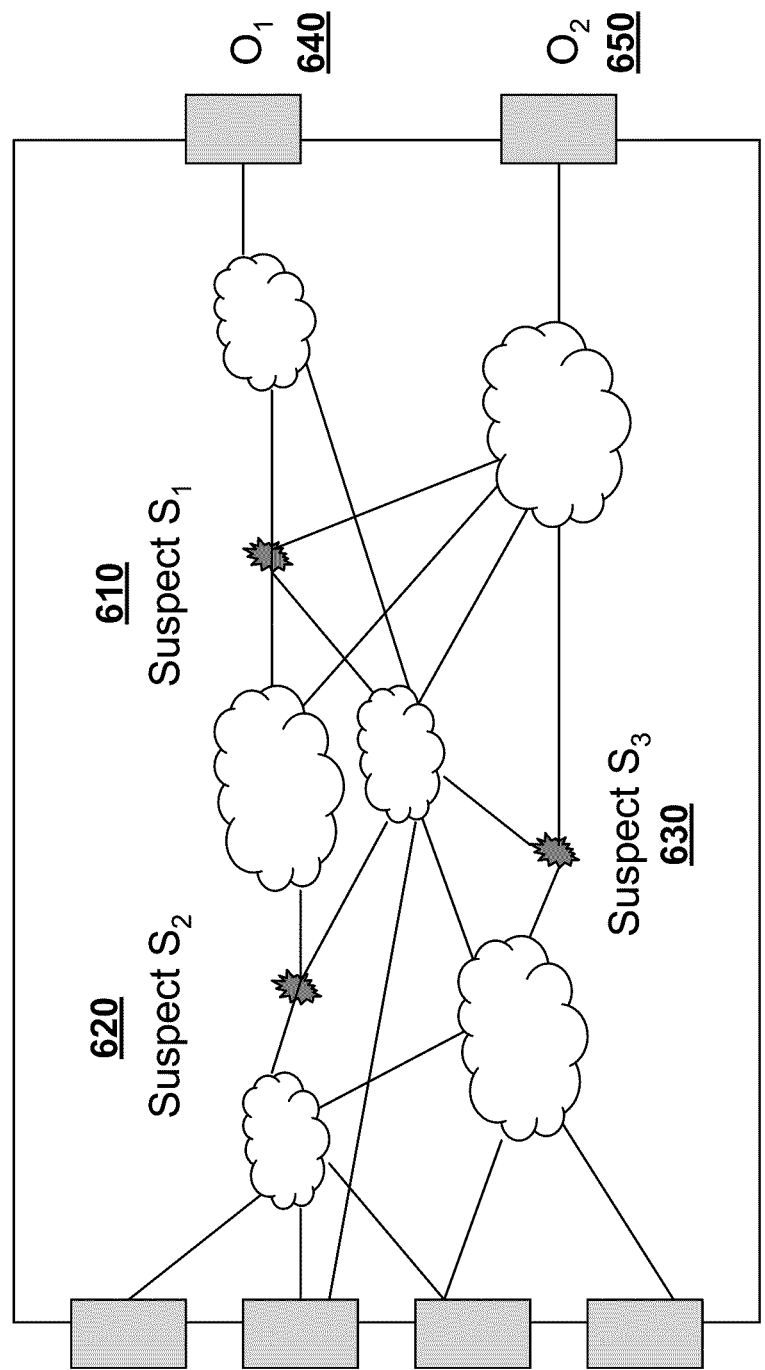
FIG. 6 illustrates a simple circuit to show long path identification operation of DTPG methods according to various embodiments of the invention.

FIG. 6 uses a simple circuit as an example to illustrate operation 420 according to various embodiments of the invention. In the figure, there are two failing observation points and three diagnosis suspects. First, N long paths that go through suspect 1 (610) and end at failing observation point 1 (640) are identified. The identified N long paths are added to a path list P. Then another set of N long paths that go through suspect 1 (610) and end at failing observe point 2 (650) are identified, which are appended to the path list P. After processing suspect 1 (610), suspect 2 (620) is processed in the same way. Suspect 3 (630) is then processed. Note that the same path might be identified for different suspects. These common paths among different suspects can keep the total number of paths much smaller than N*(Number of Suspects)*(Number of Failing Observation Points). Since the number of failing observation points is small, the total number of paths identified is usually the order of the number of diagnosis suspects (O(number of diagnosis suspects)).

In the last operation (operation 430) of the flow chart in FIG. 4, the ATPG module 330 generates test patterns for activating the long paths identified in operation 420. Many conventional ATPG tools, such as Mentor Graphics' Tessent™ TestKompress and Tessent™ FastScan and Synopsys' TetraMAX® ATPG, can be used by the diagnosis ATPG module 330. The generated test patterns can then be applied to the test 350 for improving the diagnosis resolution.

Implementation of Diagnostic Test Pattern Generation

A DTPG method according to various embodiments of the invention may be implemented and evaluated on a CPU (central processing unit) core design for which both the design netlist and the timing information in a SDF file are available.

10 test patterns for detecting transition delay faults are generated as the production test patterns. The test patterns can be simulated using a Verilog simulator with SDF information. Lumped small delay defect is injected by modifying the delay time specified in the SDF file. It should be noted that in practice, usually it requires a process that sweeps through different frequency, temperature and voltage corners to confirm a small delay defect and to collect failures for a failing chip.

For each test pattern, a small delay may be injected randomly. The defect's size is gradually increased and Verilog simulation is performed with the modified SDF file, until the injected delay fault causes a failure that is observed at an observation point. The failures from the Verilog simulation are then fed to an at-speed logic diagnosis tool to obtain the initial diagnosis suspects. One example of such a tool has been described in W.-T. Cheng, et al., "Enhancing Transition Fault Model for Delay Defect Diagnosis", ATS, 2008, pp. 179-184, which is incorporated herein by reference. The diagnosis suspects and the simulation failures may then be fed to a tool implementing DTPG methods according to various embodiments of the invention to create additional test patterns. The new diagnostic test patterns are simulated with the injected small delay defect. Simulation failures are fed to an at-speed logic diagnosis tool for improving diagnostic resolution. With some implementations of the invention, a predetermined number of long paths for each diagnosis suspect may be selected based on the logic levels (i.e. the number of gates on a path), and these paths go through the suspect and reach a failing observation point. In practice, the paths with the longest path delays based on the SDF information may be used if the SDF information is available.

Table 1 presents the diagnosis results of applying a DTPG method according to some embodiments of the invention. Here, 100 longest paths passing through a diagnosis suspect and reaching a failing observation point are used. The first column shows the index of each test pattern. The second column (#Susp) shows the number of diagnostic suspects based on production test failures. Columns 5 (#Susp) and 8 (#Susp) show the number of diagnosis suspects left after further diagnosis with diagnostic test patterns generated by a DTPG method (proposed method) according to various embodiments of the invention and by a method described in a reference (reference method, an N-detection based DTPG method), K. Gearhardt, et al., "Improving Fault Isolation using Iterative Diagnosis", ISTFA, 2008, Paper 13.2, which is incorporated herein by reference, respectively. #Pat stands for number of new diagnostic test patterns generated by either the proposed method or the reference method. #FP represents number of new failing observation points.

Table 1 shows that for all the 10 cases, the new diagnostic test patterns produce more failures (Column 4, the proposed method) that can be used by diagnosis program. For 9 out of 10 cases, the proposed method can improve the diagnostic resolution (comparing Column 2 with Column 5). For 6 of the cases the diagnostic resolution is improved to be less than five suspects. For the other 4 cases, even with the newly generated test patterns, there are still more than five diagnosis suspects. Manually analyzing some of the cases show that the proposed method can improve the diagnostic resolution very close to the best achievable diagnostic resolution. For example, for case 10, manual analysis shows that the delay effect can propagate through two paths and the best achievable diagnosis resolution is 10.

The reference method fails to create new failing observation points for 4 cases (cases 2, 6, 8 and 9) and hence there is no improvement in diagnosis resolution for these 4 cases. For the other 6 cases where both methods created additional failing patterns, the proposed method consistently achieves the same or better diagnosis results.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of diagnostic test pattern generation, comprising:
   selecting a diagnosis suspect;
   identifying, executed by at least one processor of a computer, a plurality of long paths based on one or more criteria, each of the plurality of long paths passing through the diagnosis suspect and reaching to an observation point, the observation point being a failing observation point selected from one or more failing observation points in a failure log that are associated with the diagnosis suspect; and
   generating test patterns by activating the plurality of long paths.

2. The method recited in claim 1, wherein the diagnosis suspect is one of a plurality of diagnosis suspects, the plurality of diagnosis suspects being determined by performing diagnosis of a failure log, the failure log being obtained by testing a circuit.

3. The method recited in claim 1, wherein the plurality of long paths are N longest paths passing through the diagnosis suspect and reaching the failing observation point, N being a predetermined number.

4. The method recited in claim 1, wherein one of the one or more criteria is based on the number of logic gates on a path.

5. The method recited in claim 1, wherein one of the one or more criteria is based on path delay values calculated with SDF (Standard Delay Format) timing information.

6. A non-transitory processor-readable medium storing processor-executable instructions for causing one or more processors to perform a method of diagnostic test pattern generation, the method comprising:

TABLE 1

| | Orig. | Proposed | | | Reference | | |
|---|---|---|---|---|---|---|---|
| ID | #Susp | #Pat | #FP | #Susp | #Pat | #FP | #Susp |
| 1 | 28 | 538 | 5 | 3 | 483 | 1 | 4 |
| 2 | 14 | 383 | 7 | 2 | 675 | 0 | 14 |
| 3 | 16 | 541 | 102 | 4 | 278 | 12 | 4 |
| 4 | 30 | 92 | 4 | 24 | 769 | 3 | 30 |
| 5 | 8 | 33 | 1 | 8 | 287 | 5 | 8 |
| 6 | 16 | 812 | 2 | 10 | 440 | 0 | 16 |
| 7 | 9 | 490 | 3 | 4 | 375 | 4 | 4 |
| 8 | 6 | 261 | 4 | 4 | 278 | 0 | 6 |
| 9 | 19 | 389 | 10 | 3 | 369 | 0 | 19 |
| 10 | 31 | 605 | 2 | 11 | 511 | 4 | 15 | selecting a diagnosis suspect;

identifying a plurality of long paths based on one or more criteria, each of the plurality of long paths passing through the diagnosis suspect and reaching to an observation point, the observation point being a failing observation point selected from one or more failing observation points in a failure log that are associated with the diagnosis suspect; and generating test patterns by activating the plurality of long paths.

7. The non-transitory processor-readable medium recited in claim 6, wherein the plurality of long paths are N longest paths passing through the diagnosis suspect and reaching the failing observation point, N being a predetermined number.

8. The non-transitory processor-readable medium recited in claim 6, wherein one of the one or more criteria is based on the number of logic gates on a path.

9. The non-transitory processor-readable medium recited in claim 6, wherein one of the one or more criteria is based on path delay values calculated with SDF (Standard Delay Format) timing information.

10. A system comprising one or more processors, the one or more processors programmed to perform a method of diagnostic test pattern generation, the method comprising:

selecting a diagnosis suspect;

identifying a plurality of long paths based on one or more criteria, each of the plurality of long paths passing through the diagnosis suspect and reaching to an observation point, the observation point being a failing observation point selected from one or more failing observation points in a failure log that are associated with the diagnosis suspect; and generating test patterns by activating the plurality of long paths.

11. The system recited in claim 10, wherein the plurality of long paths are N longest paths passing through the diagnosis suspect and reaching the failing observation point, N being a predetermined number.

12. A system of diagnostic test pattern generation, comprising:

a long path identification module that includes at least one processor being configured to identify, based on one or more criteria, a plurality of long paths passing through a diagnosis suspect and reaching to an observation point, the observation point being a failing observation point selected from one or more failing observation points in a failure log that are associated with the diagnosis suspect; and an ATPG (automatic test pattern generation) module being configured to generate test patterns activating the plurality of long paths.

\* \* \* \* \*